United States Patent
Avery et al.

(10) Patent No.: US 6,577,480 B1
(45) Date of Patent: Jun. 10, 2003

(54) ADJUSTABLE TRIGGER VOLTAGE CIRCUIT FOR SUB-MICROMETER SILICON IC ESD PROTECTION

(75) Inventors: Leslie Ronald Avery, Flemington, NJ (US); Peter Daryl Gardner, Lubec, ME (US)

(73) Assignee: Sarnoff Corporation, Princeton, NJ (US)

( * ) Notice: Subject to any disclaimer, the term of this patent is extended or adjusted under 35 U.S.C. 154(b) by 232 days.

(21) Appl. No.: 09/626,853

(22) Filed: Jul. 27, 2000

Related U.S. Application Data

(60) Provisional application No. 60/148,096, filed on Aug. 6, 1999.

(51) Int. Cl.[7] .............................................. H02H 9/00
(52) U.S. Cl. ........................................ 361/56; 361/111
(58) Field of Search .................................. 361/111, 56

(56) References Cited

U.S. PATENT DOCUMENTS

| | | | |
|---|---|---|---|
| 5,508,649 A | 4/1996 | Shay | 327/318 |
| 5,543,996 A | 8/1996 | Nakago | 361/90 |
| 5,617,283 A | 4/1997 | Krakauer et al. | 361/56 |
| 5,640,127 A | * 6/1997 | Metz | 327/309 |
| 5,852,540 A | 12/1998 | Haider | 361/111 |
| 6,011,415 A | * 1/2000 | Hahn et al. | 327/103 |
| 6,038,116 A | * 3/2000 | Holberg et al. | 361/56 |
| 6,285,536 B1 | * 9/2001 | Holberg et al. | 361/56 |

OTHER PUBLICATIONS

PCT International Search Report.

* cited by examiner

*Primary Examiner*—Bao Q. Vu
(74) *Attorney, Agent, or Firm*—William J. Burke

(57) ABSTRACT

An electrostatic protection (ESD) circuit for an integrated circuit (IC) includes a string of a plurality of diodes connected between a Vss line and a Vdd line. A first PMOS transistor and a first NMOS transistor are connected in series between the Vdd line and the string of diodes. The first PMOS transistor has a gate connected between two of the diodes of the string, and the NMOS transistor has a gate connected to the Vdd line. A second PMOS transistor and a second NMOS transistor are connected in series between the Vss line and the Vdd line with the PMOS transistor having a gate connected to the junction between the first PMOS transistor and the first NMOS transistor and the second NMOS transistor having a gate connected to the Vdd line. A clamp NMOS transistor is connected between the Vss line and the Vdd line and has a gate connected to the junction between the second PMOS transistor and the second NMOS transistor. A diode may be connected between the Vdd line and the second PMOS transistor.

9 Claims, 4 Drawing Sheets

US 6,577,480 B1

ADJUSTABLE TRIGGER VOLTAGE CIRCUIT FOR SUB-MICROMETER SILICON IC ESD PROTECTION

This application claims the benefit of U.S. Provisional Application Serial No. 60/148,096 filed Aug. 6, 1999.

FIELD OF THE INVENTION

The present invention relates to an electrostatic discharge (ESD) protection circuit for a sub-micrometer silicon integrated circuit (IC), and more particularly, to an adjustable trigger voltage circuit for ESD protection.

BACKGROUND OF THE INVENTION

With the MOS technology progressing into the deep sub-micrometer design rule regime, thinner gate oxides become necessary. This results in lower oxide breakdown voltages which, in turn, require ESD protection devices or circuits which trigger at much lower and lower voltages. The requirement for ESD protection to trigger at lower voltages is not easily solved. Heretofore, such devices as grounded-gate NMOS transistors and Zener diodes have been used for ESD protection. However, such devices cannot achieve semiconductor junction breakdown voltages (used in the trigger mechanisms for ESD protection structures) below the Fowler-Nordheim tunneling threshold of the thin oxides used in deep sub-micron devices. The IC devices which use deep sub-micrometer design rules have oxide breakdown voltages below 5 volts, and supply voltages down to about 1 to 2 volts. Therefore, it is desirable to have an ESD protection circuit with triggering voltages less than 5–6 volts while maintaining low leakage currents. Also, it is desirable that such ESD protection circuits use universally compatible silicon IC technology.

SUMMARY OF THE INVENTION

An ESD protection circuit having a reference source means, an adjustable offset means. and an amplifier having an input and an output. The reference source means and the adjustable offset means are connected to the input of the amplifier. A positive ESD clamp is connected to the output of the amplifier.

DETAILED DESCRIPTION OF PREFERRED EMBODIMENTS

Figure 1:
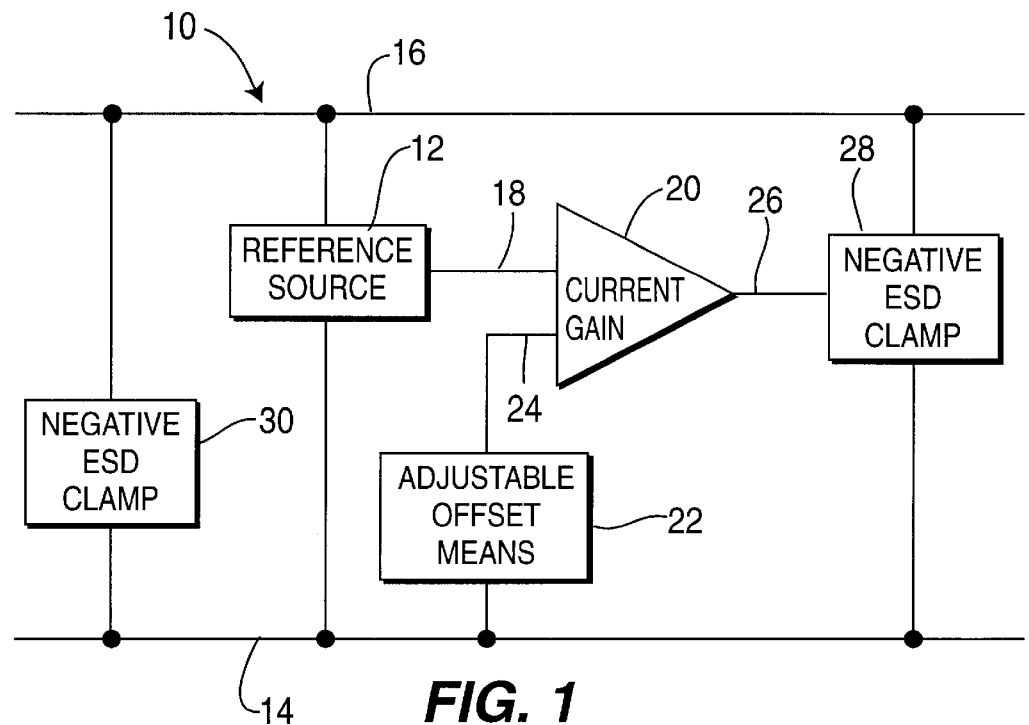
FIG. 1 is a block diagram of the basic ESD protection circuit of the present invention.

Referring initially to FIG. 1, there is shown a block diagram of the basic adjustable low-voltage trigger circuit 10 of the present invention. Circuit 10 comprises a reference source 12 connected between a Vss line 14 and a Vdd line 16. The reference source 12 is connected to one input terminal 18 of a current gain device 20, such as an amplifier. An adjustable offset means 22 is connected between the Vss line 14 and a second input terminal 24 of the current gain device 20. The current gain device 20 has an output terminal 26 which is connected to a positive ESD clamp 28. The positive ESD claim 28 is also connected between the Vss line 14 and the Vdd line 16. The circuit 10 also includes a negative ESD clamp 30 connected between the Vss line 14 and the Vdd line 16.

In the circuit 10, the reference source 12 provides the normal sub-threshold voltage current relationship (e.g. 60 mV/current decade for a silicon junction diode). The adjustable offset means 22 provides a voltage so that current conduction occurs at a higher, adjustable voltage. The current is then multiplied by the current gain device 20 by a factor to increase the voltage/current slope from 60 mV/current decade to <<60 mV/current decade. The trigger voltage can then be very low, approaching two Vbe (1.4 V). In the circuit 10, when a positive voltage is applied to the input, the Vdd line 16, there is minimal current flow through the circuit until the offset voltage is exceeded. With further small increase in input voltage the current rises rapidly, similarly to that of a diode in reverse breakdown. The end result is that an I-V characteristic is generated with a "breakdown" voltage determined by the adjustable offset voltage, with a sharp I-V slope.

Figure 2:
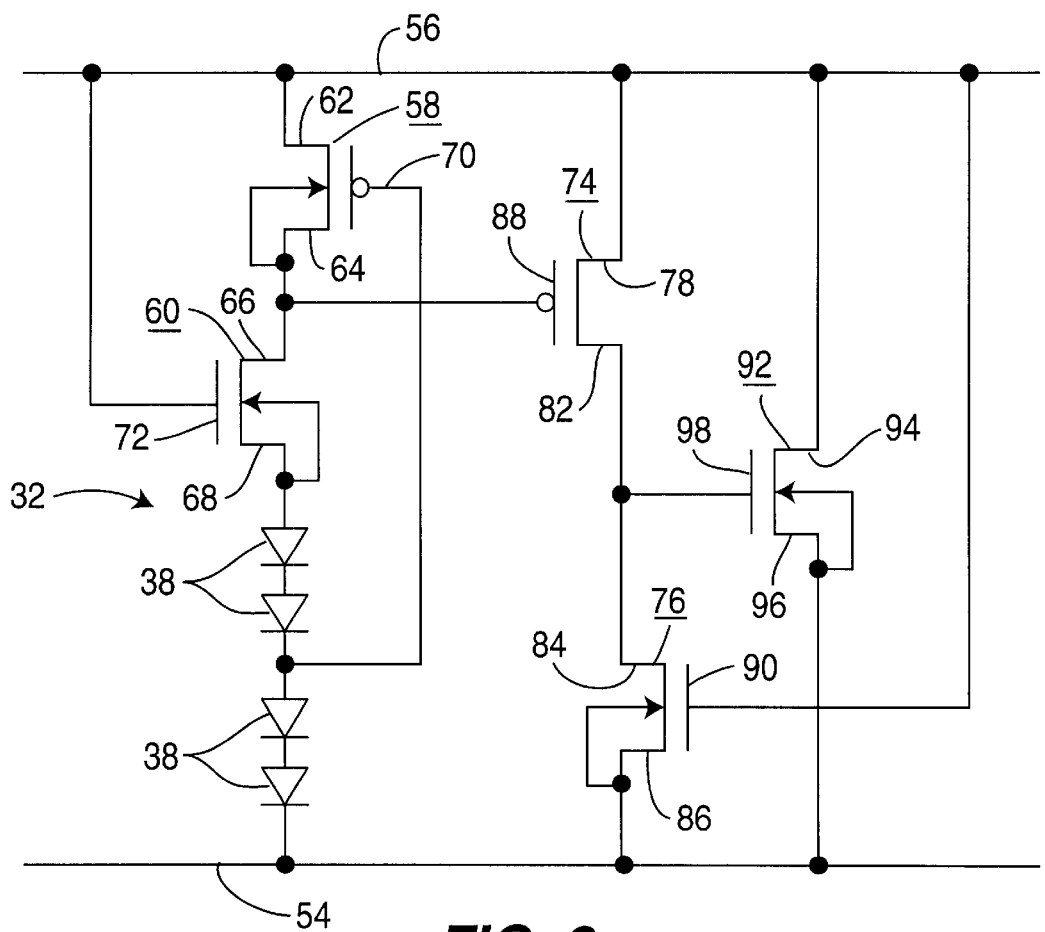
FIG. 2 is a circuit diagram of one form of the ESD protection circuit of the present invention.

Referring to FIG. 2, there is shown one form of a specific circuit 32 which forms the circuit 10 shown in FIG. 1 and which operates at a relatively low voltage (about 2.0 volts). Circuit 32 comprises a plurality of diodes 38, four being shown, connected in series between a Vss line 54 and a Vdd or ground line 56. Connected between the Vdd line 56 and the end most diode 38 is a PMOS transistor 58 and an NMOS transistor 60. The source 62 of the PMOS transistor 58 is connected to the Vdd line 56, and the drain 64 of the PMOS transistor 58 is connected to the drain 66 of the NMOS transistor 60. The source 68 of the NMOS transistor 60 is connected to the end most diode 38. The gate 70 of the PMOS transistor 58 is connected to the junction of the second and third diodes 38 in the string. The gate 72 of the NMOS transistor 60 is connected to the Vdd line 56.

A second PMOS transistor 74 and a second NMOS transistor 76 are connected between the Vss line 54 and the Vdd line 56. The channel width of PMOS transistor 76 is significantly larger than its channel length, whereas the channel length of NMOS transistor 76 is significantly larger than its channel width. The source 78 of the second PMOS transistor 74 is connected to the Vdd line 56, and the drain 82 of the PMOS transistor 74 is connected to the drain 84 of the NMOS transistor 76. The source 86 of the NMOS transistor 76 is connected to the Vss line 54. The gate 88 of the PMOS transistor 74 is connected to the junction between the drain 64 of the PMOS transistor 58 and the drain 66 of the NMOS transistor 60. The gate 90 of the NMOS transistor 72 is connected to the Vdd line 56. A third NMOS transistor 92 has its drain 94 connected to the Vdd line 56 and its source 96 connected to the Vss line 54. The gate 98 of the third NMOS transistor 92 is connected to the junction between the drain 80 of the second PMOS transistor 74 and the drain 84 of the second NMOS transistor 76.

The diodes 38, first NMOS transistor 60 and first PMOS transistor 58 form a voltage divider. The diodes must be made small so that the current will be small, keeping the DC current to very small values. The diodes form a constant voltage reference source and starve the NMOS and PMOS transistors 60 and 58 in the chain. Therefore, the current flowing through the chain is very low. The divider is designed so that the voltage at the junction of the NMOS transistor 60 and the PMOS transistor 58 is less than the threshold voltage of the second PMOS transistor 74 under normal operating conditions. As the voltage input to Vdd is increased, there will be an increasing voltage drop across the first PMOS transistor 58 which will eventually be sufficient to turn on the second PMOS transistor 74. Current flowing through the second PMOS transistor 74 will eventually exceed the current sinking capability of the second NMOS transistor 76 (a low conduction NMOS) increasing the voltage at the third NMOS transistor 92 until the threshold voltage of the third NMOS transistor 92 is reached. The third NMOS transistor 92 then turns "on" clamping the ESD voltage.

The circuit 32 only operates for positive voltages. A large diode should be connected across the Vss line 54 and the Vdd line 56, anode to Vss and cathode to Vdd, to protect the circuit under negative inputs. The clamp voltage may be adjusted to a lower value by reducing the number of diodes in the voltage divider string by one. However, the clamp voltage cannot be increased by adding a diode as the voltage at the junction of the first PMOS transistor 58 and the first NMOS transistor 60 will be high enough to increase the DC leakage current to an unacceptable value. The diodes must be made small so that the current will be small, keeping the DC current to very small values.

Figure 3:
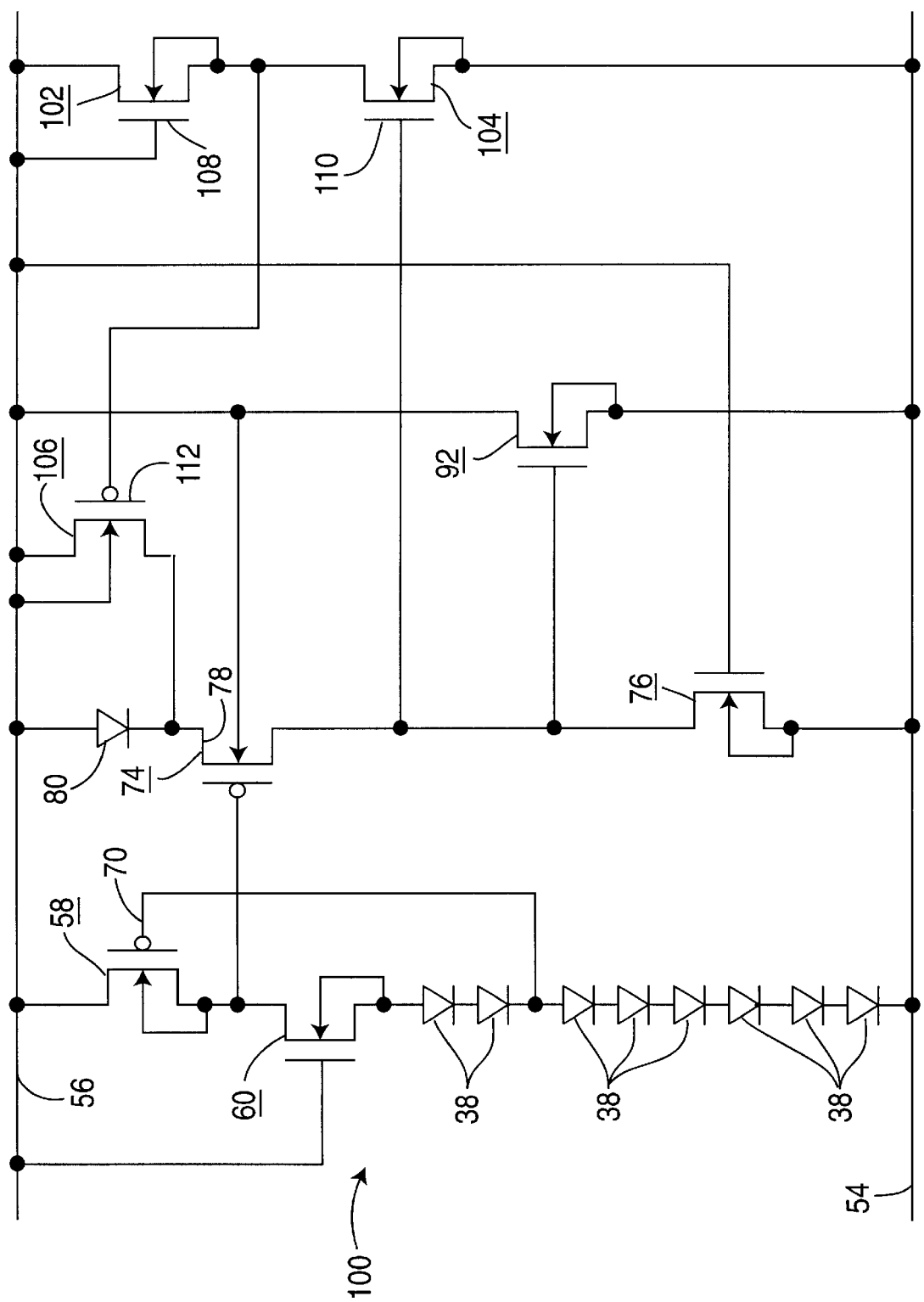
FIG. 3 is a circuit diagram of a second form of the ESD protection circuit of the present invention.

Referring to FIG. 3, there is shown another form of the circuit of the present invention, generally designated as 100, which operates at a slightly higher voltage, such as 2.8 volts, and which triggers at about 4 volts. The circuit 100 is similar to the circuit 36 shown in FIG. 2 except that for higher voltage operations it includes a greater number of diodes 38, such as eight diodes rather than four. The first PMOS transistor 58 and first NMOS transistor 60 are connected. between the Vdd line 56 and the diodes 38 with the gate 70 of the PMOS transistor 58 being connected between the third and fourth diodes 38 as in the circuit 36. The additional diodes are includes to prevent the second PMOS transistor 74 from turning "on" under normal DC conditions under the higher voltage operations. Also a diode 80 is connected between the source 78 of the second PMOS transistor 74 and the Vdd line 56. The diode 80 increases the voltage required to turn the second PMOS transistor 74 "on" by a diode forward drop.

Diode 80 has the disadvantage that the maximum drive voltage to the gate of the third NMOS transistor 92 is reduced by the forward voltage drop of the diode 80. The reduction in gate drive voltage reduces the effectiveness of the clamp NMOS transistor 92 to carry current. To circumvent this problem, shunt circuitry is provided. The shunt circuitry comprises a pair of NMOS transistors 102 and 104 connected between the Vss line 54 and the Vss line 56, and a PMOS transistor 106. The gate 108 of the NMOS transistor 102 is connected to the Vdd line 54, and the gate 110 of the NMOS transistor 104 is connected to the junction between the second PMOS transistor 74 and the second NMOS transistor 76. The PMOS transistor 106 is connected between the Vdd line 54 and the junction between the diode 80 and the second PMOS transistor 74. The gate 112 of the PMOS transistor 106 is connected to the junction between the NMOS transistor 102 and the NMOS transistor 104.

The circuit 100 operates in the same manner as the circuit 36 previously described, except at a higher voltage because of the additional diodes. However, the gate 110 of the NMOS transistor 104 turns "on" at the same time as the clamping NMOS transistor 92. When the clamp NMOS transistor 92 turns "on", the voltage drop across the NMOS transistor 102 turns the PMOS transistor 106 "on" shunting diode 80. This maximizes the voltage drive to the gate of the clamp NMOS transistor 92.

Figure 4:
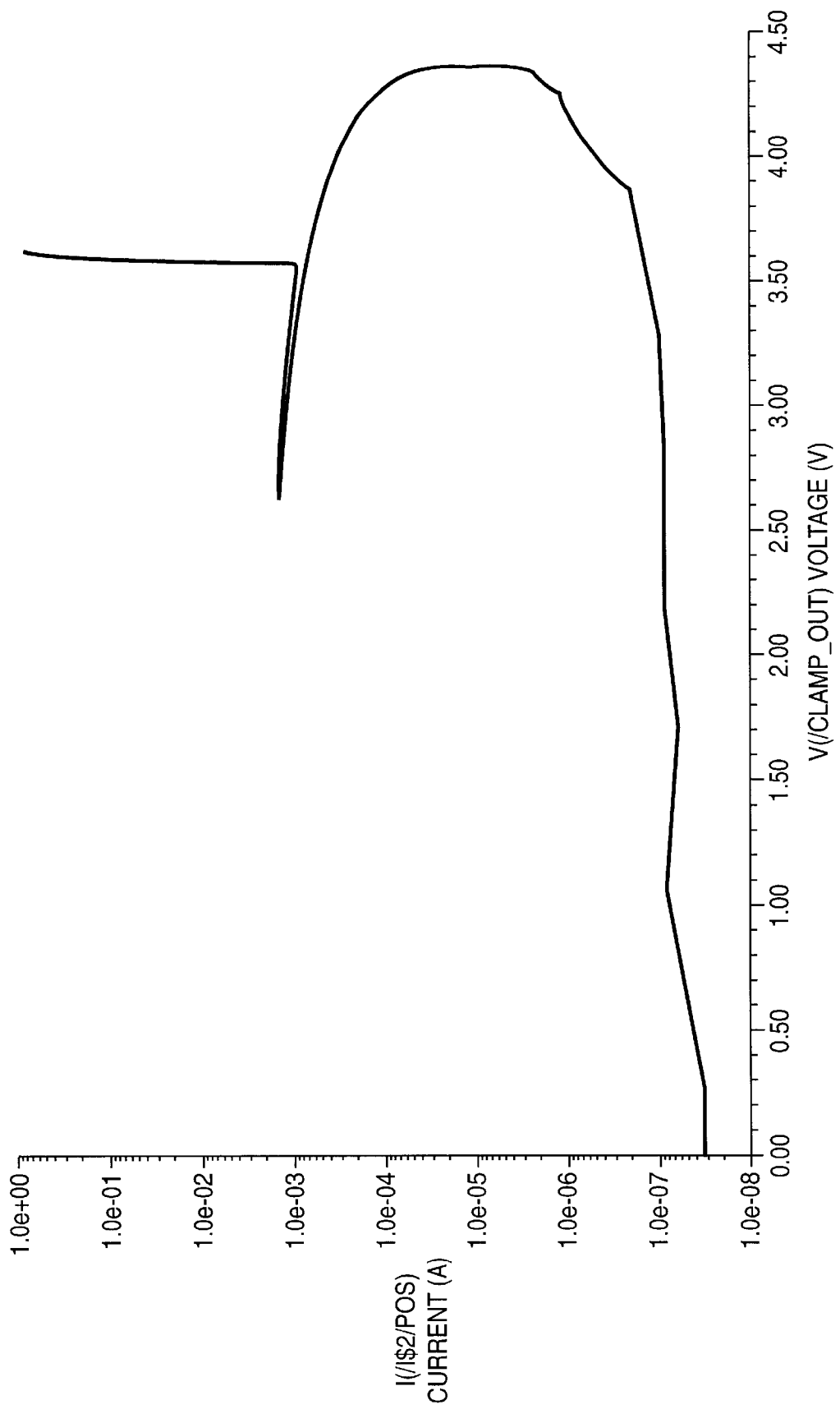
FIG. 4 is a graph showing the I-V characteristics of the circuit shown in FIG. 3.

FIG. 4 is a graph showing the I-V characteristics obtained from the circuit 100 shown in FIG. 3. As can be seen in FIG. 4, as the current increases the voltage increases until it reaches a threshold. Then the voltage snaps back to a steady voltage. The snap back characteristic is the result of the PMOS transistor 112 turning on and shunting diode 80. This increases the drive to the clamp NMOS 92. The very steep I-V slope after this point is evident in the graph.

Figure 5:
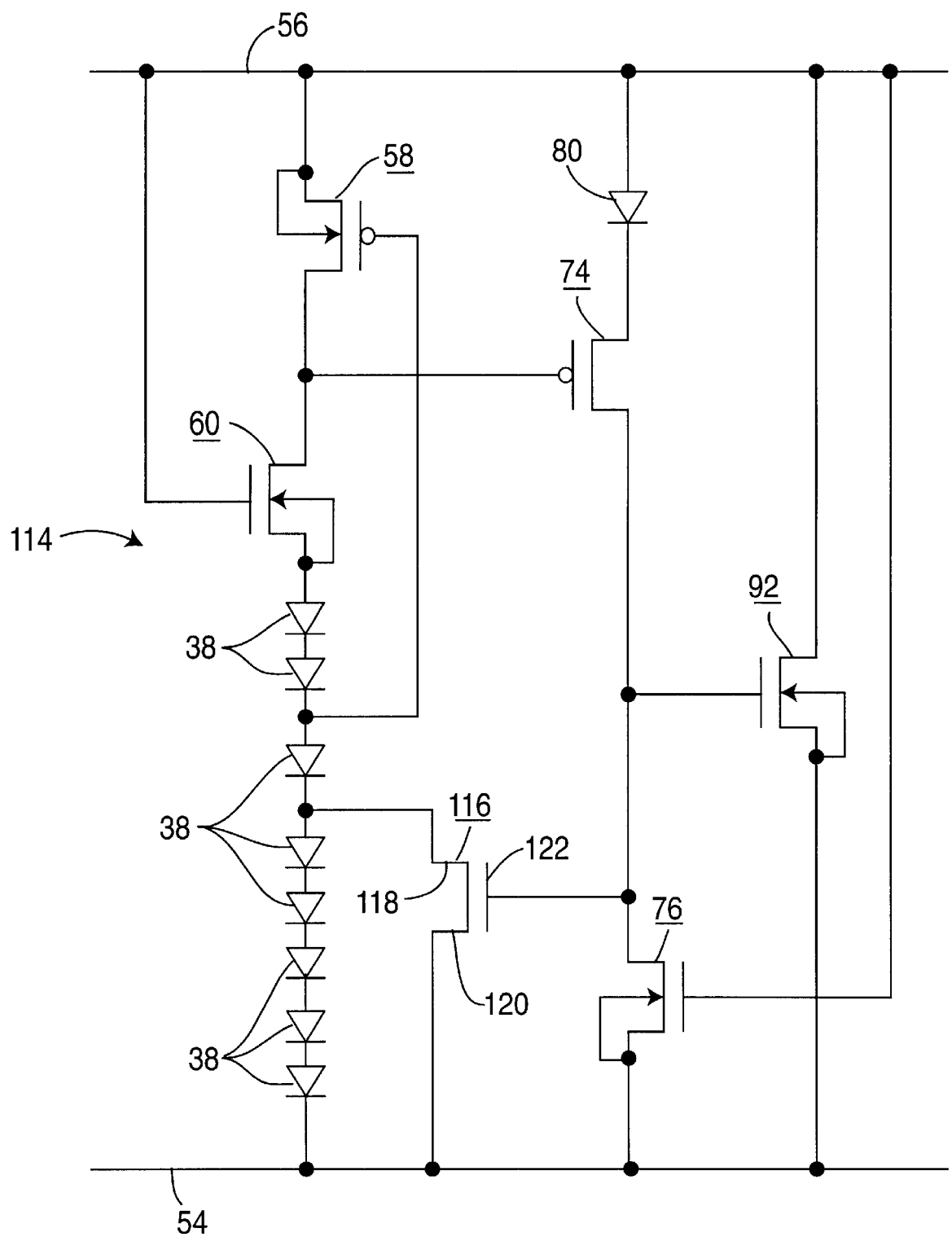
FIG. 5 is a circuit diagram of a third form of the ESD protection circuit of the present invention.

Referring to FIG. 5, there is shown a third version of the circuit of the present invention, generally designated as 114, which also operates at the higher voltage, about 2.8 volts, and triggers as 4 volts. The circuit 114 is the same as the circuit 100 in that it includes eight diodes 38 in the string and a diode 80 between the second PMOS transistor 74 and the Vss line 54. However, instead of the shunt circuitry included in the circuit 100, the drive voltage to the clamp NMOS transistor 92 is maximized by a NMOS transistor 116 connected across the string of diodes 38. The drain 118 of the NMOS transistor 116 is connected between the third and fourth diodes 38, and the source 120 of the NMOS transistor 116 is connected to the Vdd line 56. The gate 122 of the NMOS transistor 116 is connected to the same node as the gate 98 of the clamp NMOS transistor 92.

In the operation of the circuit 114, the NMOS transistor 116 turns "on" at the same time as the clamp NMOS transistor 92, shunting the string of diodes 38. This increases the voltage drive to the gate 88 of the second PMOS transistor 74, turning it "on" harder, and reducing the voltage drop across it. However, the voltage drop across the diode 80 is not eliminated. Therefore. this circuit is simpler than the circuit 100 shown in FIG. 3.

Thus, there is provided by the present invention an ESD protection circuit which triggers at relatively low voltages so that it can be used to sub-micrometer silicon integrated circuits. Also, the circuit is adjustable to provide for triggering at different voltages.

What is claimed is:

1. An ESD protection circuit for operating with a Vss line and a Vdd line comprising:

a string of a plurality of diodes connected in series between the Vss line and the Vdd line;

a first PMOS transistor and a first NMOS transistor connected in series between the Vss line and one end of the string of diodes, the PMOS transistor having a gate which is connected between two of the diodes of the string, and the NMOS transistor having a gate which is connected to the Vdd line;

a second PMOS transistor and a second NMOS transistor connected in series between the Vss line and the Vdd line, the second PMOS transistor having a gate which is connected between the first PMOS transistor and the first NMOS transistor, and the second NMOS transistor having a gate which is connected to the Vdd line; and a clamp NMOS transistor connected between the Vss line and the Vdd line, the clamp NMOS transistor having a gate which is connect between the second PMOS transistor and the second NMOS transistor.

2. The ESD protection circuit of claim 1 wherein the string of diodes includes four diodes, and the gate of the first PMOS transistor is connected between the second and third diode in said string.

3. The ESD protection circuit of claim 1 wherein the string of diodes includes eight diodes with the gate of the first PMOS transistor being connected between the second and third diode of said string.

4. The ESD protection circuit of claim 3 further comprising a ninth diode connected between the Vdd line and the second PMOS transistor.

5. The ESD protection circuit of claim 4 further comprising a shunt circuit between the Vdd line and the Vss line.

6. The ESD protection circuit of claim 5 in which the shunt circuit includes a pair of shunt NMOS transistors connected in series between the Vss line and the Vdd line, one of the shunt NMOS transistors having a gate which is connected to the Vdd line and the other shunt NMOS transistor having a gate which is connected to the junction between the second PMOS transistor and the second NMOS transistor, and a shunt PMOS transistor in parallel with the diode and having a gate connected to the junction between the two shunt NMOS transistor.

7. The ESD protection circuit of claim 4 further comprising a third NMOS transistor connected between the string of diodes and the Vss line.

8. The ESD protection circuit of claim 7 in which the third NMOS transistor has a drain connected between two of the diodes of the string of diodes; and a gate connected to the same node as the clamp NMOS transistor gate.

9. The ESD protection circuit of claim 8 in which the drain of the third NMOS transistor is connected between the third and fourth diodes of the string of diodes.

* * * * *

UNITED STATES PATENT AND TRADEMARK OFFICE
CERTIFICATE OF CORRECTION

PATENT NO. : 6,577,480 B1
DATED : June 10, 2003
INVENTOR(S) : Avery et al.

It is certified that error appears in the above-identified patent and that said Letters Patent is hereby corrected as shown below:

Column 1,
Line 40, please change "means. and" to -- means, and --.

Column 2,
Line 42, please change "transistor 76" to -- transistor 74 --.
Line 53, please change "72 is connected" to -- 76 is connected --.

Column 3,
Line 49, please change "Vss line 56" to -- Vdd line 56 --.
Lines 51 and 55, please change "Vdd line 54" to -- Vdd line 56 --.

Column 4,
Line 14, please change "Vss line 54" to -- Vdd line 56 --.
Line 20, please change "Vdd line 56" to -- Vss line 54 --.

Signed and Sealed this

Thirteenth Day of January, 2004

JON W. DUDAS
*Acting Director of the United States Patent and Trademark Office*